United States Patent
Nieminen et al.

(10) Patent No.: US 11,962,212 B2
(45) Date of Patent: Apr. 16, 2024

(54) ELECTRICAL WINDINGS FOR A LOW PRESSURE ENVIRONMENT

(71) Applicant: HYPERLOOP TECHNOLOGIES, INC., Los Angeles, CA (US)

(72) Inventors: Juha Nieminen, Los Angeles, CA (US); Arbi Gharakhani Siraki, Los Angeles, CA (US); Rachel Ozer, Los Angeles, CA (US)

(73) Assignee: HYPERLOOP TECHNOLOGIES, INC., Los Angeles, CA (US)

( * ) Notice: Subject to any disclaimer, the term of this patent is extended or adjusted under 35 U.S.C. 154(b) by 248 days.

(21) Appl. No.: 17/774,090

(22) PCT Filed: Nov. 5, 2020

(86) PCT No.: PCT/US2020/059036
§ 371 (c)(1),
(2) Date: May 3, 2022

(87) PCT Pub. No.: WO2021/092123
PCT Pub. Date: May 14, 2021

(65) Prior Publication Data
US 2022/0385126 A1 Dec. 1, 2022

Related U.S. Application Data

(60) Provisional application No. 62/945,978, filed on Dec. 10, 2019, provisional application No. 62/931,987, (Continued)

(51) Int. Cl.
*H02K 41/03* (2006.01)
*H01F 7/06* (2006.01)
(Continued)

(52) U.S. Cl.
CPC .............. *H02K 41/03* (2013.01); *H01F 7/064* (2013.01); *H01F 7/081* (2013.01); *H01F 27/28* (2013.01);
(Continued)

(58) Field of Classification Search
CPC .............. G11B 15/17; G11B 15/67549; G11B 23/08735; G11B 25/066; B60L 13/03;
(Continued)

(56) References Cited

U.S. PATENT DOCUMENTS 4,544,856 A   10/1985  King
4,689,529 A    8/1987  Higuichi
(Continued)

FOREIGN PATENT DOCUMENTS

DE          19732564 A1    2/1999
DE     102006027819 A1   12/2007
(Continued)

OTHER PUBLICATIONS

Zavelcuta, Florin, Examiner, "International Search Report" dated Mar. 1, 2021, issued in corresponding PCT Application No. PCT/US2020/059010, Filed Nov. 5, 2020.
(Continued)

*Primary Examiner* — Naishadh N Desai
(74) *Attorney, Agent, or Firm* — Seyfarth Shaw LLP

(57) ABSTRACT

Electrical windings for a low-pressure environment are provided. The electrical windings include a body having an aperture and electrical conductors wound about the aperture in the body; a conductive layer at the body, the conductive layer arranged to electrically shield the electrical conductors; electrical connectors at one or more external sides of the body, the electrical connectors electrically connected to the electrical conductors; an insulating housing containing electrical connections between the electrical connectors and
(Continued)

the electrical conductors; a conducting faceplate at the insulating housing, grounding portions of the electrical connectors attached to the conducting faceplate; and a conductive coating on the insulating housing, the conductive coating electrically connected to the conducting faceplate and the conductive layer.

9 Claims, 9 Drawing Sheets

Related U.S. Application Data filed on Nov. 7, 2019, provisional application No. 62/932,113, filed on Nov. 7, 2019, provisional application No. 62/932,077, filed on Nov. 7, 2019, provisional application No. 62/931,935, filed on Nov. 7, 2019, provisional application No. 62/932,013, filed on Nov. 7, 2019.

(51) Int. Cl.
```
H01F 7/08       (2006.01)
H01F 27/28      (2006.01)
H02K 1/14       (2006.01)
H02K 1/18       (2006.01)
H02K 1/20       (2006.01)
H02K 3/04       (2006.01)
H02K 5/22       (2006.01)
H02K 9/22       (2006.01)
H02K 11/21      (2016.01)
H02K 11/25      (2016.01)
H02K 41/025     (2006.01)
H02K 49/04      (2006.01)
H05K 7/20       (2006.01)
H02K 7/10       (2006.01)
```

(52) U.S. Cl.
CPC ............ *H02K 1/14* (2013.01); *H02K 1/143* (2013.01); *H02K 1/18* (2013.01); *H02K 1/20* (2013.01); *H02K 3/04* (2013.01); *H02K 5/225* (2013.01); *H02K 9/227* (2021.01); *H02K 11/21* (2016.01); *H02K 11/25* (2016.01); *H02K 41/025* (2013.01); *H02K 41/031* (2013.01); *H02K 49/046* (2013.01); *H05K 7/20254* (2013.01); *H01F 2007/086* (2013.01); *H02K 7/10* (2013.01); *H02K 2201/15* (2013.01); *H02K 2213/12* (2013.01)

(58) Field of Classification Search
CPC ....... B60L 15/2009; B60L 7/28; H02K 11/40; H02K 2201/15; H02K 2213/12; H02K 3/04; H02K 3/18; H02K 3/40; H02K 3/52; H02K 41/03; H02K 5/225; H02K 1/14; H02K 1/141; H02K 1/143; H02K 1/148; H02K 1/18; H02K 1/185; H02K 1/20; H02K 11/21; H02K 11/25; H02K 15/022; H02K 2201/12; H02K 41/025; H02K 41/031; H02K 49/046; H02K 7/10; H02K 7/104; H02K 9/227; Y02T 10/64; Y02T 10/72; H01F 2007/086; H01F 27/28; H01F 7/064; H01F 7/081; H05K 7/20254

See application file for complete search history.

(56) References Cited

U.S. PATENT DOCUMENTS

| | | | |
|---|---|---|---|
| 4,788,477 A * | 11/1988 | Teramachi | H02K 41/033 318/135 |
| 5,289,088 A | 2/1994 | Andoh | |
| 5,868,077 A * | 2/1999 | Kuznetsov | B60L 13/08 104/285 |
| 6,522,035 B1 | 2/2003 | Smit | |
| 2002/0053835 A1 | 5/2002 | Joong et al. | |
| 2002/0081528 A1 | 6/2002 | Miyajima et al. | |
| 2005/0029874 A1 | 2/2005 | Dadd | |
| 2006/0131967 A1 | 6/2006 | Lin et al. | |
| 2012/0249991 A1 | 10/2012 | Hol et al. | |
| 2013/0015725 A1 | 1/2013 | Trammell | |
| 2013/0113320 A1 | 5/2013 | Calley et al. | |
| 2015/0091393 A1 | 4/2015 | Hayner et al. | |
| 2015/0171706 A1 | 6/2015 | Dadd | |
| 2018/0131258 A1 | 5/2018 | Dawidowicz | |
| 2018/0166953 A1* | 6/2018 | Han | H02K 5/203 |

FOREIGN PATENT DOCUMENTS

| | | |
|---|---|---|
| EP | 0093547 A1 | 11/1983 |
| EP | 1213819 A2 | 6/2002 |
| EP | 1511164 A2 | 3/2005 |
| EP | 1544980 A1 | 6/2005 |
| EP | 2876783 A1 | 5/2015 |
| EP | 3107195 A1 | 12/2016 |
| EP | 3258131 A1 | 12/2017 |
| FR | 1165541 A1 | 10/1958 |
| FR | 2526570 A1 | 11/1983 |
| JP | S586055 A | 1/1983 |
| JP | S5886859 A | 5/1983 |
| JP | S6098864 A | 6/1985 |
| WO | 03105317 A1 | 12/2003 |
| WO | 2008142001 A2 | 11/2008 |

OTHER PUBLICATIONS

Contreras, Sampayo, J., Examiner, "International Search Report" dated Feb. 15, 2021, issued in corresponding PCT Application No. PCT/US2020/059012, Filed Nov. 5, 2020.
Molnar, Sabinus, "International Search Report" dated Feb. 23, 2021, issued in corresponding PCT Application No. PCT/US2020/059017, Filed Nov. 5, 2020.
Molnar, Sabinus, "International Search Report" dated Feb. 24, 2021, issued in corresponding PCT Application No. PCT/US2020/059023, Filed Nov. 5, 2020.
Contreras, Sampayo, J., "International Search Report" dated Apr. 15, 2021, issued in corresponding PCT Application No. PCT/US2020/059028, Filed Nov. 5, 2020.
Kovacsovics, Martin, "International Search Report", dated Mar. 1, 2021, issued in corresponding PCT Application No. PCT/US2020/059036, Filed Nov. 5, 2020.

* cited by examiner

ELECTRICAL WINDINGS FOR A LOW PRESSURE ENVIRONMENT

CROSS-REFERENCE TO RELATED APPLICATIONS

This application claims priority from U.S. Provisional Patent Applications having Ser. Nos. 62/932,113, 62/932,013, 62/931,935, 62/931,987, 62/932,077, all of which were filed on Nov. 7, 2019, and the entire contents of which are incorporated herein by reference; this application further claims priority from U.S. Provisional Patent Application having Ser. No. 62/945,978, filed on Dec. 10, 2019, the entire contents of which is incorporated herein by reference.

BACKGROUND

The constraints of a transportation system that seeks to promote high speed, high efficiency, and high power density, impose challenges that are not present in the state of the art. In particular, such a transportation system may include electromagnetic machines and/or electromagnetic actuators moving in a low-pressure environment, which may cause a corona which erodes surfaces of the electromagnetic machine. Electrical windings of the electromagnetic machine may be most vulnerable to such a corona.

BRIEF DESCRIPTIONS OF THE DRAWINGS

For a better understanding of the various examples described herein and to show more clearly how they may be carried into effect, reference will now be made, by way of example only, to the accompanying drawings in which:

FIG. 1 depicts a perspective view of an electrical winding for a low-pressure environment, according to non-limiting examples.

FIGS. 2A, 2B, and 2C depict perspective views of a process for attaching and/or adding electrical connectors to the electrical winding of FIG. 1, according to non-limiting examples.

FIGS. 3A, 3B, and 3C depict top schematic views of an alternative process for attaching and/or adding electrical connectors to an electrical winding, according to non-limiting examples.

Figure 5:
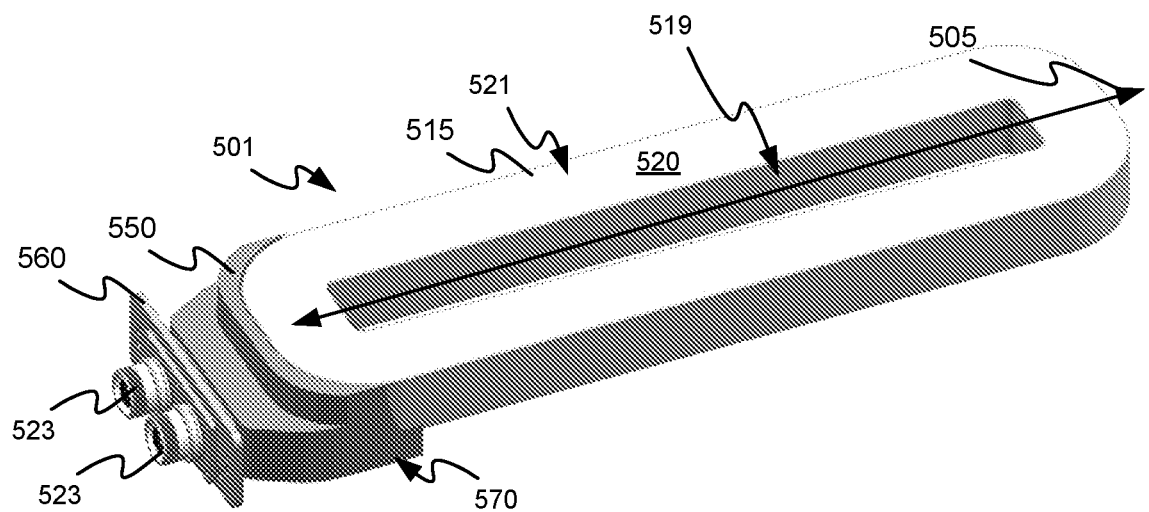
FIG. 5 depicts a perspective view of an electrical winding with electrical connectors located at a longitudinal end, according to non-limiting examples.
Figure 6A:
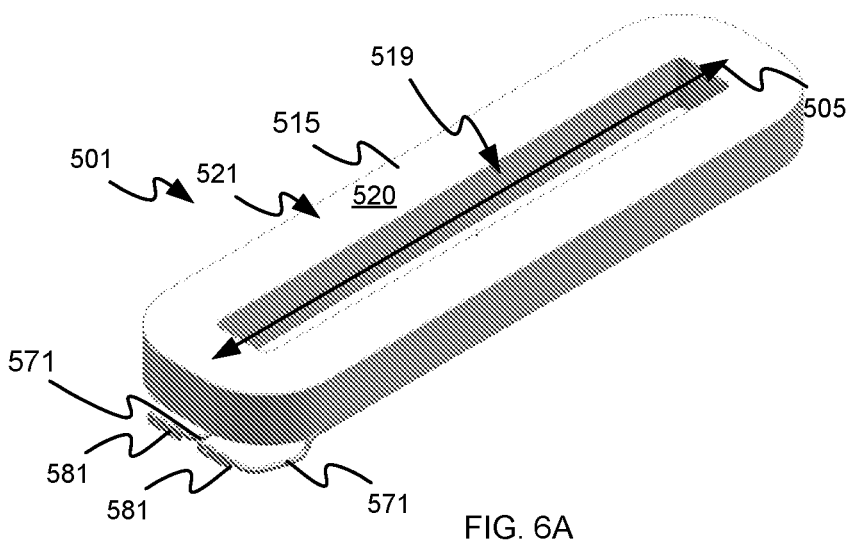
Figure 6B:
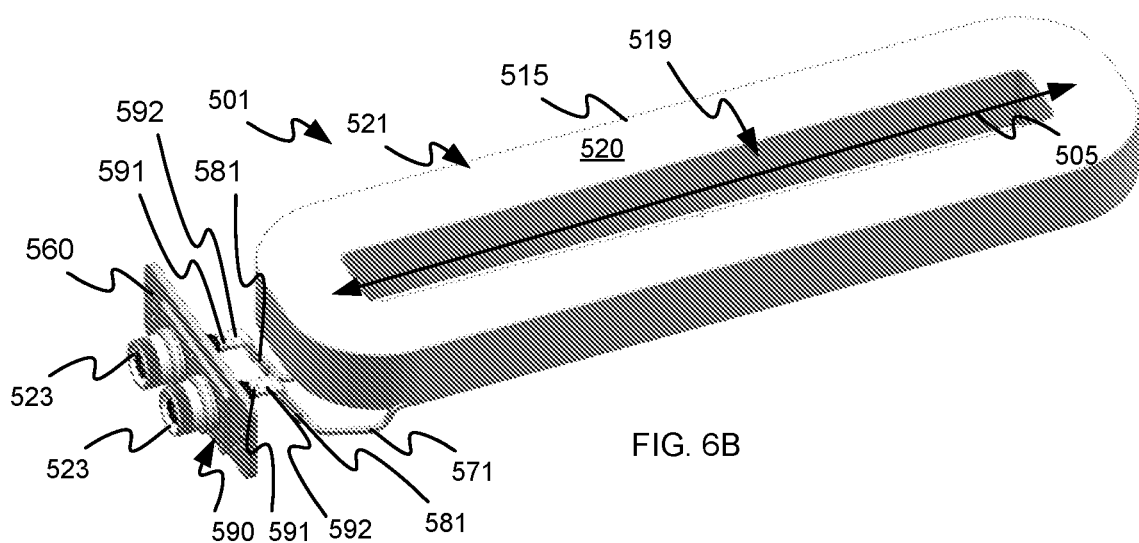
Figure 6C:
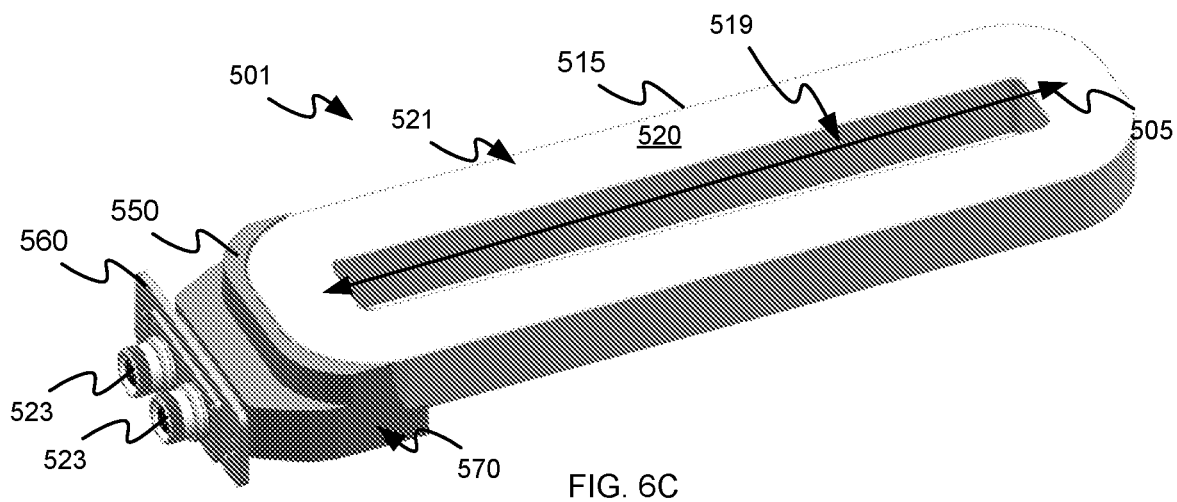

FIGS. 6A, 6B, and 6C depict perspective views of a process for adding connectors to the electrical winding to the electrical winding of FIG. 5, according to non-limiting examples.

Figure 7:
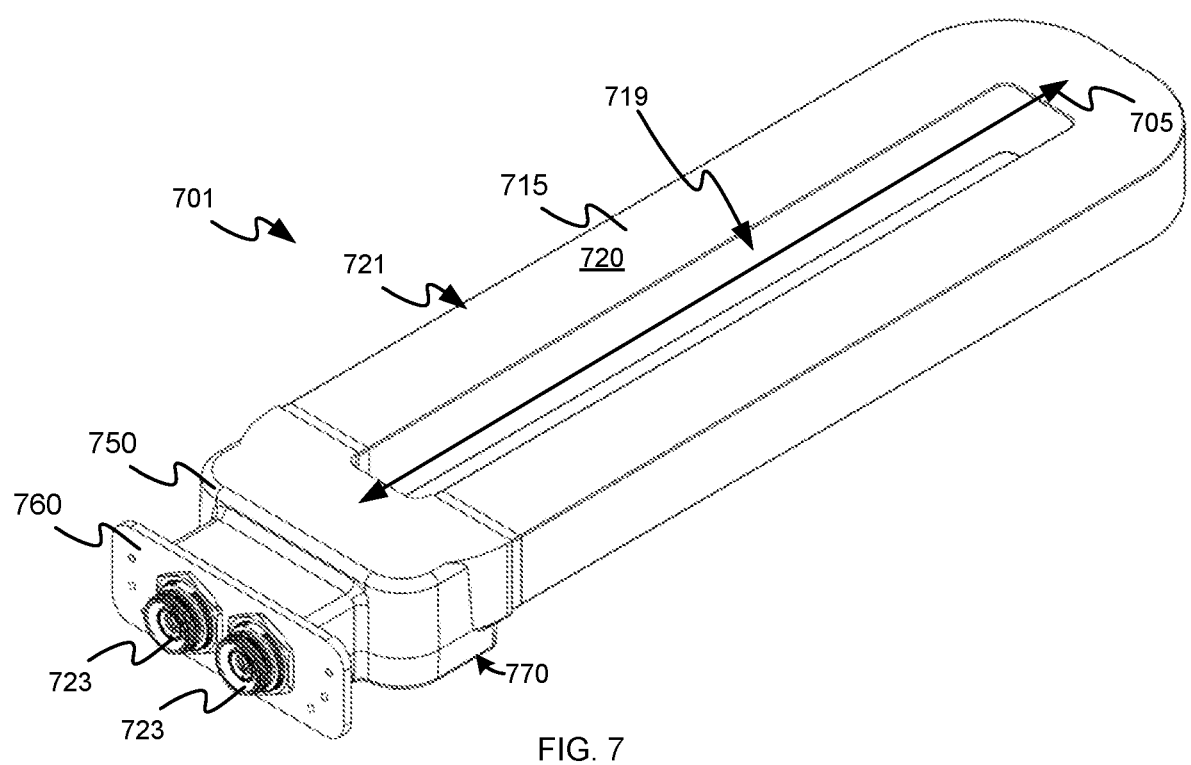

FIG. 7 depicts a perspective view of an alternative replaceable winding, according to non-limiting examples.

Figure 8:
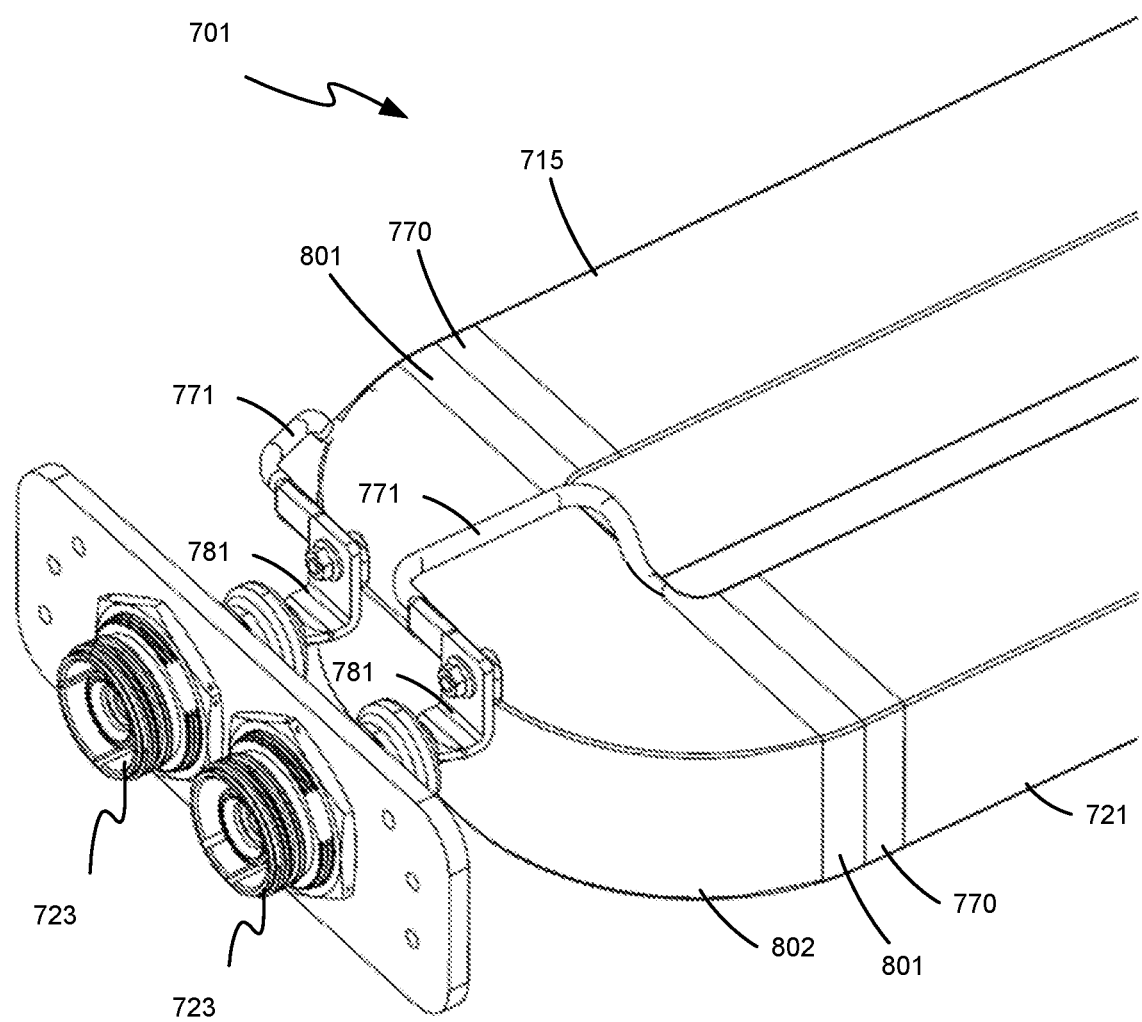

FIG. 8 depicts a perspective view of an end of the replaceable winding of FIG. 7 that includes connectors, with an encapsulating housing removed, according to non-limiting examples.

Figure 9:
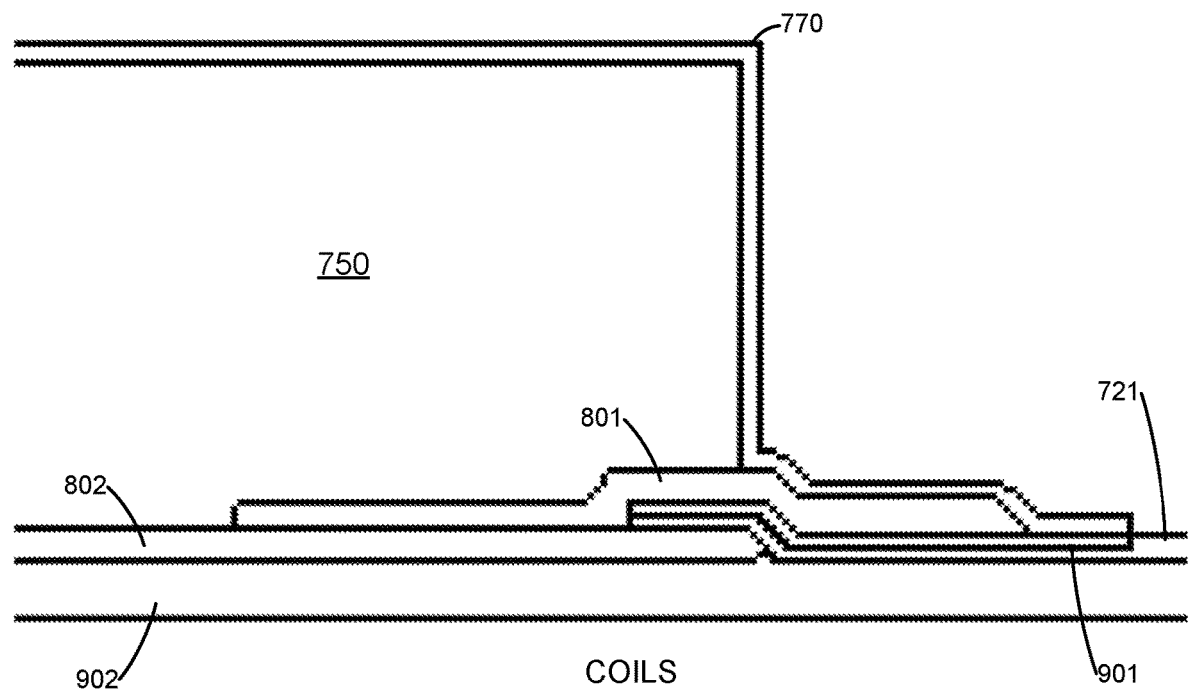

FIG. 9 depicts a schematic diagram of electrical connections between conductive layers of the replaceable winding of FIG. 7, according to non-limiting examples.

DETAILED DESCRIPTION

The constraints of a transportation system that seeks to promote high speed, high efficiency, and high power density, impose challenges that are not present in the state of the art. In particular, such a transportation system may include electromagnetic machines and/or electromagnetic actuators moving in a low-pressure environment, which may cause a corona (i.e. an electrical corona) which erodes surfaces of the electromagnetic machine. Electrical windings of the electromagnetic machine may be most vulnerable to such a corona.

In particular, electrical windings around pole portions of an electromagnetic machine and/or electromagnetic actuator (referred to interchangeably hereafter as an electromagnetic machine) may be particularly vulnerable to corona effects in a low-pressure environment. For example, a corona is generally ionization of air that results in electron bombardment of surfaces, and hence leads to erosion thereof. As electrical windings may generally be the least robust component of an electromagnetic machine, they may be particularly sensitive to corona effects and/or erosion.

In general, surfaces of an electromagnetic machine for a low-pressure environment should be at a ground potential to prevent corona, however this can be particularly challenging for electrical windings. The issue may be further exacerbated when the electrical windings are replaceable and/or removable and hence may include electrical connectors to a power source. It may hence more challenging to provide replaceable electrical windings than non-replaceable electrical windings.

Hence, provided herein is an electrical winding for an electromagnetic machine comprising: a body having an aperture and electrical conductors wound about the aperture in the body; a conductive layer at the body, the conductive layer arranged to electrically shield the electrical conductors; electrical connectors at one or more external sides of the body, the electrical connectors electrically connected to the electrical conductors; an insulating housing containing electrical connections between the electrical connectors and the electrical conductors; a conducting faceplate at the insulating housing, grounding portions of the electrical connectors attached to the conducting faceplate; and a conductive coating on the insulating housing, the conductive coating electrically connected to the conducting faceplate and the conductive layer.

Figure 1:
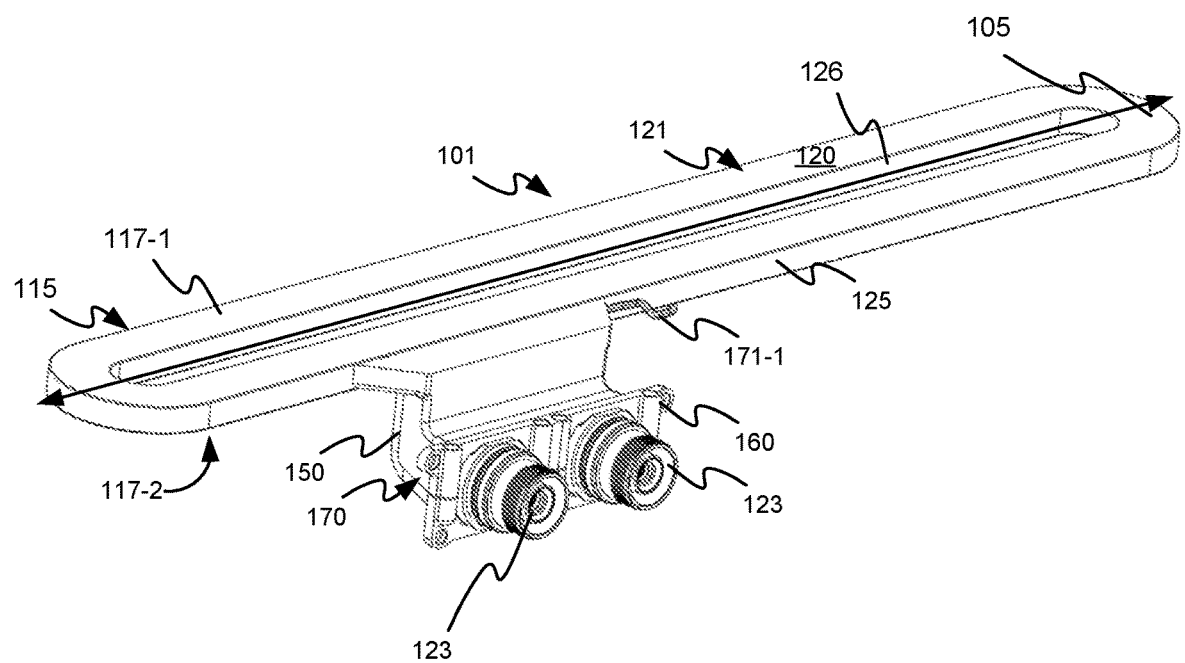

Attention is next directed to FIG. 1 which depicts a perspective view of an electrical winding 101 for an electromagnetic machine. Such an electromagnetic machine may be attached to a pod and/or vehicle and/or payload used in a high speed transport system which may be deployed on land, underground, overland, overwater, underwater, and the like; a pod and/or vehicle and/or payload of the highspeed transport system may comprise a vehicle, and the like, for transporting cargo and/or passengers, and the like, and/or any other suitable payloads. In general, the electrical winding 101 is replaceable at an electromagnetic machine and may, for example, be placed on pole portions of such electromagnetic machines, and removed when damaged, and the like. Operation of the electrical winding 101 with particular electromagnetic machines is described in Applicant's co-US provisional application entitled "REPLACEABLE WINDINGS FOR AN ELECTROMAGNETIC MACHINE", having U.S. Ser. No. 62/932,013, filed on a Nov. 7, 2019, and incorporated herein by reference.

As depicted, the electrical winding 101 has a length longer than a width, and hence is arranged along a longitudinal axis 105. In general, the electrical winding 101 comprises: a body 115 having an aperture 119, and electrical conductors wound about the aperture 119 in the body 115. While the electrical conductors are not depicted, the electrical conductors are understood to be internal to the body 115 and form an electrical coil within the body 115. Furthermore, the electrical winding 101 and/or the body 115 may be any suitable shape. For example, while the body 115 of the electrical winding 101 is depicted as planar and arranged along the longitudinal axis 105, the body 115 may have steps and or kinks, and/or have any suitable shape which may be arranged along the longitudinal axis 105 or not arranged along the longitudinal axis 105, which may enable the electrical winding 101 to be removable and/or replaceable.

Further, as depicted, the body 115 comprises opposing surfaces 117-1, 117-2 along the longitudinal axis 105 (e.g. top and bottom surfaces, the bottom surface 117-2 not visible in FIG. 1, but understood to be "underneath" the body 115). Terms such as "top" and "bottom" are understood to be with respect to pages of the figures, and are not meant to imply a specific orientation of the electrical winding 101.

The electrical winding 101 further comprises an external surface and/or surfaces 120.

The electrical winding 101 further comprises a conductive layer 121 at the body 115, the conductive layer 121 arranged to electrically shield the electrical conductors within the body 115. While described in more detail below, the conductive layer 121 may be located between the external surface 120 of the body 115 and the electrical conductors therein and/or at least partially beneath an insulating layer (not depicted) at the external surface 120 of the body 115.

The electrical winding 101 further comprises electrical connectors 123 (e.g. a pair of electrical connectors 123) at one or more external sides of the body 115, the electrical connectors 123 electrically connected to the electrical conductors, as described in more detail below. The electrical connectors 123 generally include portions (e.g. ports and the like) which receive and/or convey power from a power source via complementary plugs and/or connectors of the power source, and grounding portions which may be connected to grounding portions of the power source (e.g. grounding portions of the plugs and/or connectors of the power source). As depicted, the grounding portions of the electrical connectors 123 are threaded such that the electrical connectors 123 may be mated to grounding portions of plugs and/or connectors of the power source that have complementary threads, though any suitable devices for mating the electrical connectors 123 an external power source is within the scope of the present specification.

As depicted, the electrical connectors 123 are located at an external side 125 of the body 115, for example in a "primary-winding position" and/or along the external side 125 of the body 115 about parallel to the longitudinal axis 105. However, the electrical connectors 123 may be at any suitable position relative to the body 115 which allows the electrical winding 101 to be replaceable at an electromagnetic machine, including, but not limited to, an "end-winding position" (e.g. described below with respect to FIG. 5).

In general, the external surface 120 of the body 115 includes the surfaces 117, the external sides of the body 115 (including the external side 125), and an internal side and/or sides 126 of the aperture 119.

The electrical winding 101 further comprises an insulating housing 150 containing electrical connections between the electrical connectors 123 and the electrical conductors, described in more detail below.

The electrical winding 101 further comprises a conducting faceplate 160 at the insulating housing 150, grounding portions of the electrical connectors 123 attached to the conducting faceplate 160. The faceplate 160 may comprise a frame and/or bracket and the like to which the electrical connectors 123 are attached.

The electrical winding 101 further comprises a conductive coating 170 on the insulating housing 150, the conductive coating 170 electrically connected to the conducting faceplate 160 and the conductive layer 121, as described in more detail below.

Also depicted in FIG. 1 is an electrical connection 171-1 from the electrical conductors (e.g. which form a coil) inside the electrical winding 101 (e.g. and/or the body 115). In particular, the electrical connection 171-1 is from an internal side 126 of the aperture 119 to one of the electrical connectors 123, for example via the insulating housing 150 of the connectors 123, within which the electrical connection connects to a first connector 123, of the electrical connectors 123. Hence, the electrical connection 171-1 may run along the "bottom" surface 117-2 (not visible in FIG. 1) of the body 115 that opposes the "top" surface 117-1 (visible in FIG. 1).

As will be described in further detail with respect to FIG. 2A, the electrical winding 101 further comprises a second electrical connection 171-2 from the external side 125 of the electrical winding 101 to a second connector 123, of the electrical connectors 123; however, in FIG. 1, the second electrical connection 171-2, and the connection to the second electrical connector 123, are generally located within the insulating housing 150.

The insulating housing 150 may be formed from any suitable electrically insulating encapsulation material, which may include, but is not limited to, hard materials, soft materials, plastics, resin, and/or another suitable material.

Indeed, the body 115 of the electrical winding 101 may also generally be encapsulated with any suitable electrically insulating encapsulation material, such as a resin, which may form an insulating layer, for example at the external surface 120 of the body 115.

The faceplate 160, to which the electrical connectors 123 are attached via respective grounding portions, generally spaces the electrical connectors 123 from each other, and/or holds the electrical connectors 123 in a fixed position, for example for compatibility with one or more plugs and/or connectors from a power source of a complimentary configuration that plug into the electrical connectors 123. The electrical connectors 123, and in particular the grounding portions thereof, generally extend (e.g. outward) from the faceplate 160, and electrical leads from the ports, and the like, generally extend towards the body 115 (e.g. inward).

Figure 2A:
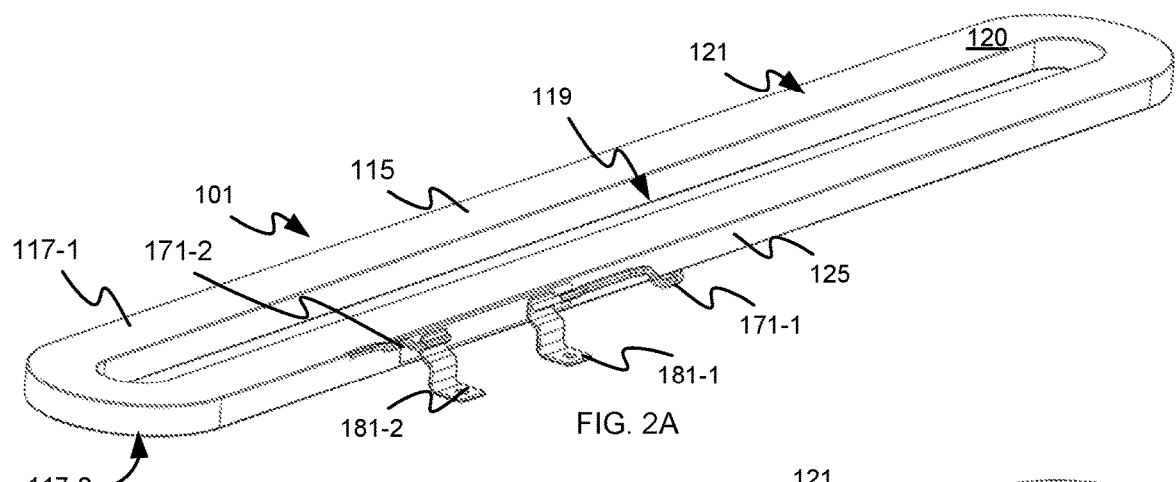
Figure 2B:
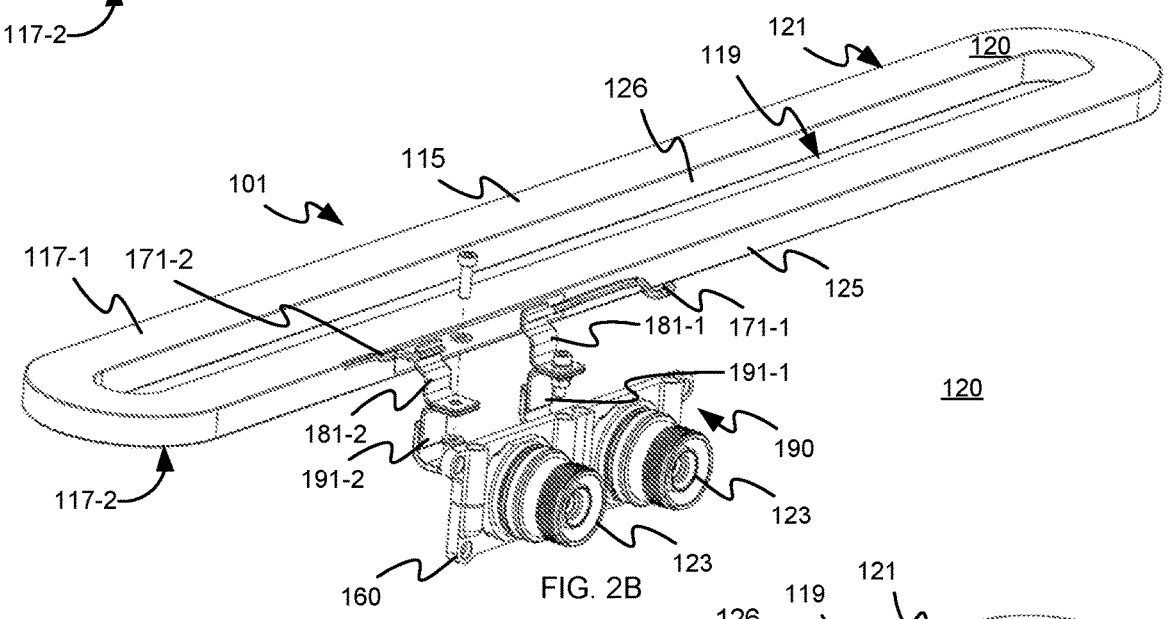
Figure 2C:
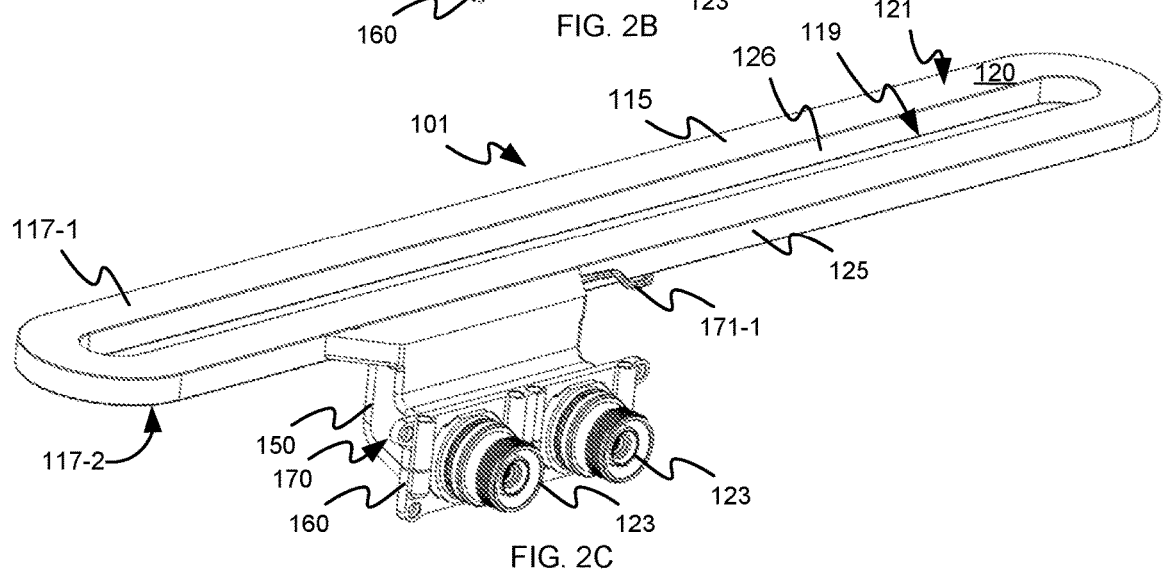

Attention is next directed to FIG. 2A, FIG. 2B and FIG. 2C which depict perspective views of a process for adding and/or attaching the electrical connectors 123 to the electrical winding 101.

It is understood in FIG. 2A, FIG. 2B and FIG. 2C that the body 115 has been generally encapsulated with an insulating encapsulation material. Further, in some examples, prior to encapsulating the body 115, the conductive layer 121 may be applied around the electrical conductors in the body 115, which form the coil in the body 115 in a manner that does not electrically short the conductive layer 121 to the electrical conductors in the body 115. For example, such electrical conductors are understood to be insulated from each other within the body 115 (e.g. the electrical conductors may comprise insulated wires), and hence the conductive layer 121 may be applied on insulation of the electrical conductors, and/or the electrical conductors may be first have an insulating layer (e.g. an internal insulating layer) applied thereto, with the conductive layer 121 applied to such an insulating layer (e.g. and the electrically insulating encapsulation material may then also be applied).

The body 115 may alternatively be coated with the conductive layer 121 after being encapsulated with the electrically insulating encapsulation material (e.g. the conductive layer 121 may be on the electrically insulating encapsulation material). In other examples, the conductive layer 121 may be partially located beneath the electrically insulating encapsulation material and/or integrated with the electrically insulating encapsulation material (e.g. when the insulating encapsulant material impregnates the conductive layer 121). In these examples the conductive layer 121 may be electrically accessible by removing a portion of the electrically insulating encapsulation material at the external surface 120 of the body 115 (e.g. by abrading and/or scraping the electrically insulating encapsulation material at a region where electrical contact with the conductive layer 121 is to occur).

Hence, the conductive layer 121 may be provided in any suitable manner at the body 115, such that the conductive layer 121 electrically shields the electrical conductors in the body 115. For example, the conductive layer 121 may be located between the external surface 120 of the body 115 and the electrical conductors. Alternatively, the conductive layer 121 may be located at and/or on the external surface 120 of the body 115. Alternatively, the conductive layer 121 may be located at least partially beneath an insulating layer at the external surface 120 of the body 115. Alternatively, the conductive layer 121 may be integrated with the insulating layer at the external surface 120 of the body 115.

However, coatings and/or layers of the body 115 may have any suitable configuration that includes the conductive layer 121. In particular, the conductive layer 121 may surround the electrical conductors in the body 115 and/or be located at and/or beneath all external surfaces 120 of the body 115.

Attention is next directed to FIG. 2A which depicts the electrical winding 101 without the electrical connectors 123 and with the electrical connections 171-1, 171-2 from electrical conductors (e.g. which form a coil) inside the electrical winding 101 (e.g. and/or the body 115). Indeed, the electrical connections 171-1, 171-2 may comprise opposite ends of the electrical conductors inside the electrical winding 101. As depicted, the electrical connection 171-1 is from an internal side 126 of the aperture 119 (e.g. opposite the external side 125), and the electrical connection 171-2 is from the external side 125 of the electrical winding 101.

In the example of FIG. 2A, the electrical connections 171-1, 171-2 may be connected (e.g. via brazing, and the like) to respective busbars 181-1, 181-2 which extend towards the opposing surface 117-2 and may be generally L-shaped and/or any other suitable shape (e.g. such that ends thereof extend outward from the external side 125). Prior to being connected to the busbars 181-1, 181-2, an insulating layer of the electrical connections 171-1, 171-2 may be removed at an area of connection to the busbars 181-1, 181-2.

With reference to FIG. 2B, a unit 190 that includes the electrical connectors 123, and respective busbars 191-1, 191-2, electrically connected to electrical leads from ports, and the like, of the electrical connectors 123 (e.g. the electrical leads extending inwards towards the body 115), may be attached to the busbars 181-1, 181-2 via respective bolts (e.g. with one bolt of the busbars 181-1, 191-1 being shown in an exploded view in FIG. 2B). The busbars 181-1, 181-2, 191-1, 191-2 are interchangeably referred to hereafter, collectively, as the busbars 181, 191, and generically as a busbar 181, 191. In particular, in these examples, the busbars 181, 191 include complementary bolt holes. However, the busbars 181, 191 may be electrically connected in any suitable manner, including brazing, and the like. Furthermore, when the busbars 181, 191 are of different conducting materials, one or more of the busbars 181, 191 may be coated with any suitable conducting material to prevent a galvanic pair from forming between the busbars 181, 191.

The unit 190 may include the electrical connectors 123 being attached and/or spaced from one another via the faceplate 160 and the like, the electrical connectors 123 extending from the faceplate 160, and with grounded portions of electrical connectors 123 attached the faceplate 160. The electrical connectors 123 are electrically connected to respective busbars 191, which may extend in a "U" shape (e.g. which may be formed in combination with electrical leads of the electrical connectors 123) from a rear side of the electrical connectors 123 to mate with and/or attach to, respective busbars 181. While specific configurations and/or shapes of the busbars 181, 191 are depicted, the busbars 181, 191 may have any suitable respective configuration and/or respective shape.

With reference to FIG. 2C, a portion of the unit 190, the busbars 181, 191, a portion of the electrical connection 171-1, and the electrical connection 171-2, may be encapsulated using an electrically insulating encapsulation material, as described above, forming the insulating housing 150, which may hence alternatively be referred to interchangeably, herein, as an encapsulating housing.

The housing 150 is then coated with the conductive coating 170 using any suitable process and/or material. Such a conductive coating 170 may be applied after masking portions (e.g. ports, and the like) of the electrical connectors 123 that connect with plugs, and the like, of an external power source (e.g. such that the conductive coating 170 does not short to the portions of the electrical connectors 123 which convey power from a power source). Portions of the electrical connection 171-1 external to the housing 150 may also be coated with the conductive coating 170 and/or a surface of the electrical connection 171-1, external to the housing 150, may include the conductive layer 121 and be shorted to the conductive coating 170.

The conductive coating 170 is applied such that the conductive coating 170 is electrically connected to the conducting faceplate 160 and the conductive layer 121.

In some examples, where the body 115 includes an insulating layer, as described above, the insulating layer may be partially removed (e.g. scraped and/or abraded) in at least one region adjacent to the housing 150 prior to applying the conductive coating 170. The conductive coating 170 may be applied such that the conductive coating 170 is electrically connected to the conductive layer 121 the region adjacent to the housing 150 where the insulating layer is partially removed.

Regardless, the process depicted in FIG. 2A, FIG. 2B, and FIG. 2C results in conductive layers and/or coatings electrically shielding the electrical winding 101 and/or surfaces of the electrical winding 101. The conductive layers and/or coatings are generally shorted to each other such the conductive layers and/or coatings may be connected to a common ground, for example via the power source that connects to the electrical connectors 123 and/or via an electromagnetic machine, to which the electrical winding 101 may be attached. For example, when the electrical winding 101 is attached to the electromagnetic machine, the conductive layers and/or coatings of the electrical winding 101 may electrically short to electrically conductive components thereof (e.g. frame, mounting devices, brackets, a back-iron portion, and the like) which may be electrically shorted to a pod and/or vehicle and/or payload to which the electromagnetic machine is attached. In these examples, the electromagnetic machine, the conductive layers and/or coatings of the electrical winding 101 and surfaces of the pod and/or vehicle and/or payload may be at a common ground.

Such a configuration generally prevents a corona from forming at least at the electrical winding 101 which may reduce and/or prevent erosion at the electrical winding 101 due to a corona. Such a configuration may further generally prevent a corona from forming at an electromagnetic machine (and/or the pod and/or vehicle and/or payload), to which the electrical winding 101 may be attached, moves in a low-pressure environment, which protects an electromagnetic machine, the pod and/or vehicle and/or payload, and the electrical winding 101 from erosion due to a corona.

Attention is next directed to FIG. 3A, 3B, 3C, and FIG. 4, which depict top schematic views of an alternative process for adding connectors to an electrical winding 301. The electrical winding 301 is generally similar to the electrical winding 101 and, with reference to FIG. 3A, comprises the body 115, the aperture 119, the conductive layer 121 and the electrical connections 171-1, 171-2 as described above. As is more clearly seen in FIG. 3A, the electrical connections 171-1, 171-2 each comprise a wire 303, and the like, coated with an insulating material 304, with a portion of the insulating materials 304 removed, and the like, to expose the wires 303.

Figure 3A:
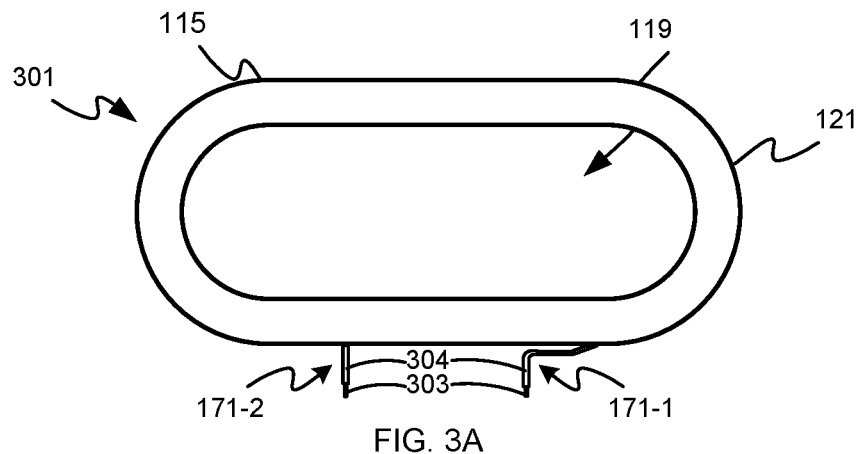
Figure 3B:
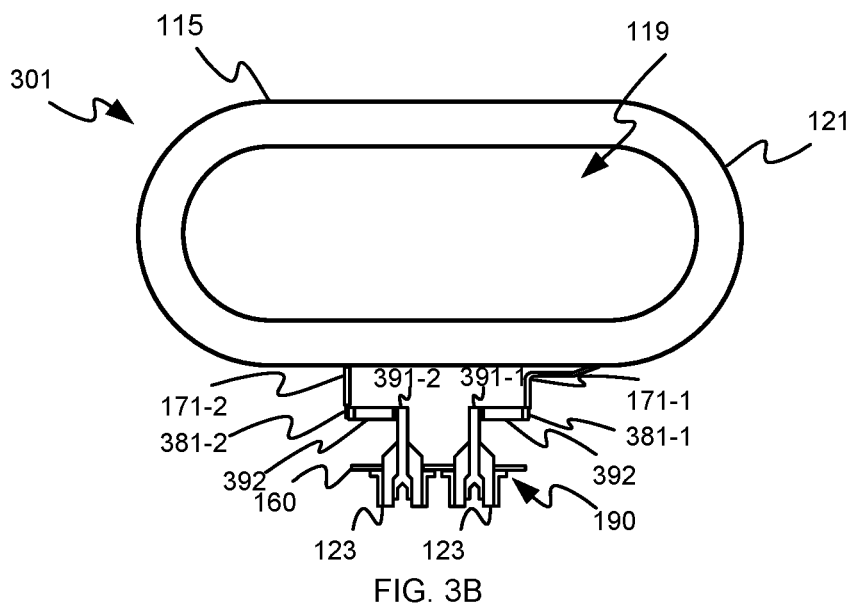

For example, with reference to FIG. 3B, busbars 381-1, 381-2 may be connected and/or brazed to the wires 303 of the electrical connections 171-1, 171-2, the busbars 381-1, 381-2 extending towards each other.

As depicted, the unit 190, including the electrical connectors 123 and the faceplate 160, includes electrical leads 391-1, 391-2 from the electrical connectors 123 which electrically connect to the busbars 381-1, 381-2; for example, the electrical leads 391-1, 391-2 extend from ports of the electrical connectors 123 inwards, towards the body 115, and the busbars 381-1, 381-2 are spaced such that when the unit 190 is positioned relative to the body, the respective busbars 381-1, 381-2 may overlap and/or touch respective electrical leads 391-1, 391-2, such that the busbars 381-1, 381-2 may be brayed to respective electrical leads 391-1, 391-2, as depicted in FIG. 3B. However, the busbars 381-1, 381-2 may be electrically connected to respective electrical leads 391-1, 391-2 in any suitable manner, including using bolts and/or further busbars, and the like, as described above with respect to the busbars 191.

While specific configurations and/or shapes of the busbars 381-1, 381-2, and the electrical leads 391-1, 391-2 are depicted, the busbars 381-1, 381-2, and the electrical leads 391-1, 391-2 may have any suitable respective configuration and/or respective shape.

Indeed, in the configurations shown in both FIG. 2B and FIG. 3B, busbars may be eliminated and the connections 171-1, 171-2 may be connected to electrical leads (e.g. the electrical leads 391-1, 391-2, and the like) of the electrical connectors 123.

In some examples, as depicted, respective regions of electrical connection between the busbar 381-1 and the electrical lead 391-1, and between the busbar 381-2 and the electrical lead 391-2, may be wrapped in an electrically insulating tape 392, for example to assist with encapsulation via the housing 150, as described hereafter.

Figure 3C:
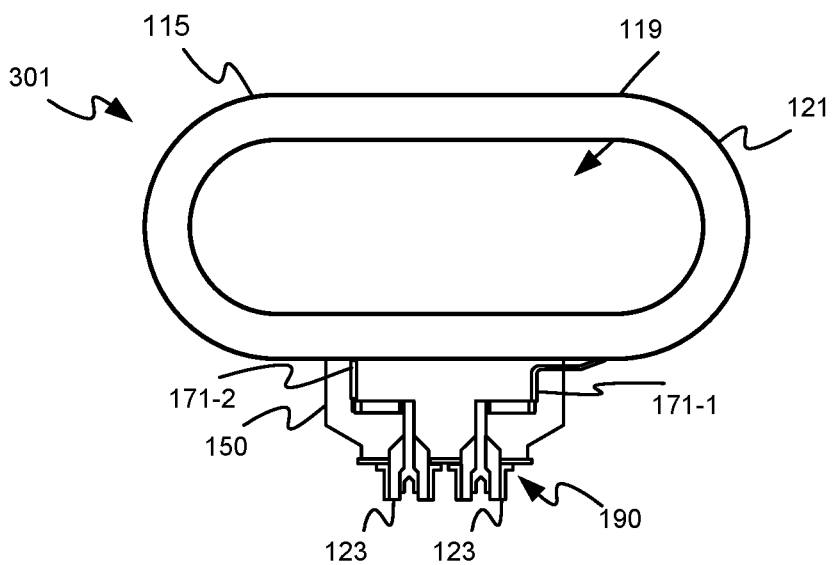

With reference to FIG. 3C, a portion of the unit 190, the busbars 381-1, 381-2, the electrical leads 391-1, 391-2, a portion of the electrical connection 171-1, and the electrical connection 171-2 may be encapsulated and using an electrically insulating encapsulation material, as described above, forming the insulating housing 150. The electrically insulating tape 392 may assist with such encapsulation.

Figure 4:
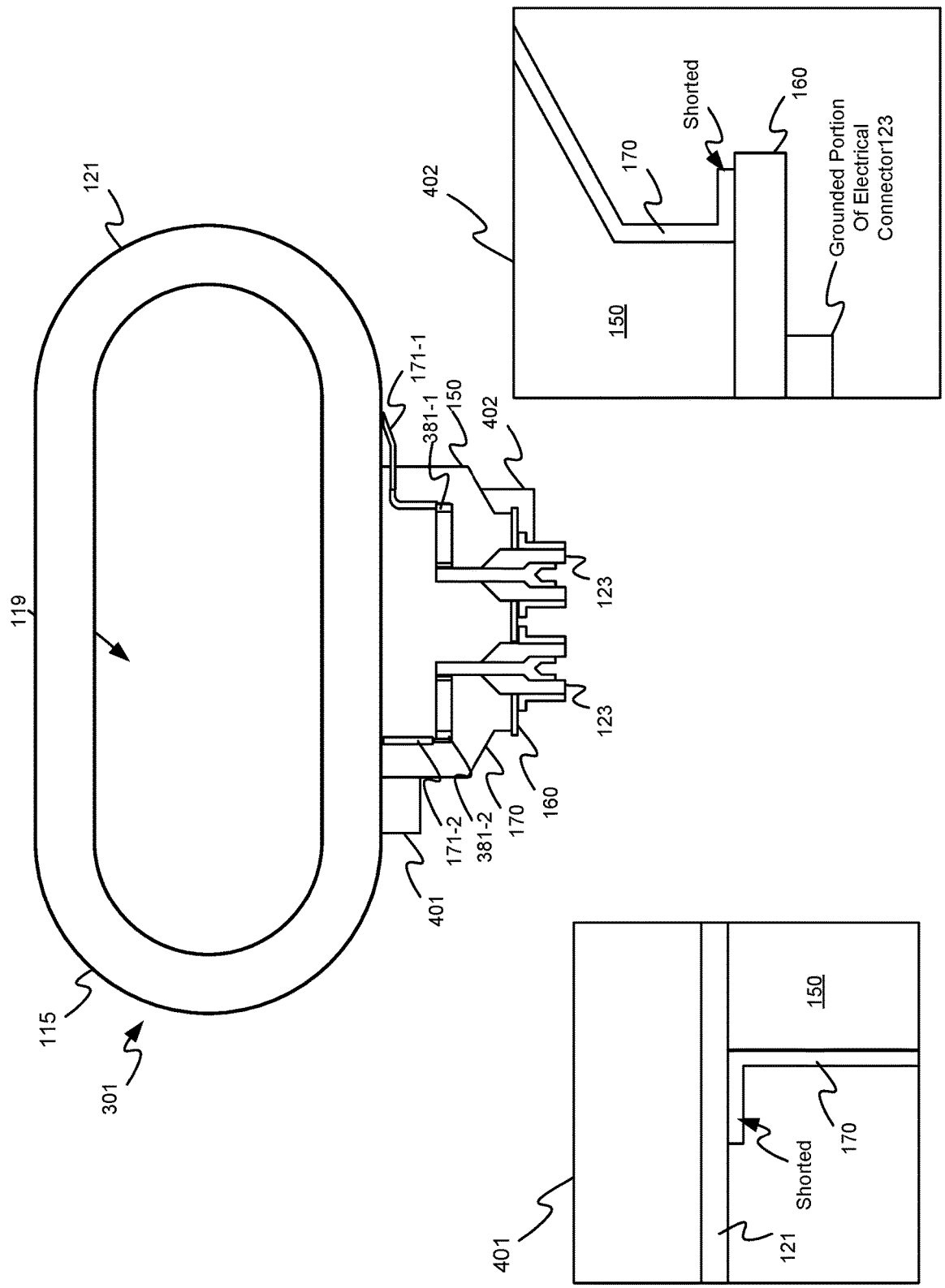
FIG. 4 depicts details of a conductive coating on an insulating housing of the electrical winding of FIG. 1, according to non-limiting examples.

Attention is next directed to FIG. 4 which depicts the electrical winding 301 with the conductive coating 170 applied to the insulating housing 150, as well as detail of regions 401, 402. In particular, the detail of the region 401 depicts that the conductive coating 170 has been applied such that the conductive coating 170 is shorted to the conductive layer 121 of the body 115. For example, an insulating layer at the body 115 may be at least partially removed (e.g. abraded and/or scraped) in the region 401, prior to the application of the conductive coating 170, such that when the conductive coating 170 is applied, the conductive coating 170 is shorted to the conductive layer 121. However, in other examples, the conductive layer 121 may be on the external surface 120 of the body 115, and hence the conductive coating 170 is shorted to the conductive layer 121 when the conductive coating 170 is applied (e.g. without removing material at the body 115).

Similarly, the detail of the region 402 depicts that the conductive coating 170 has been applied such that the conductive coating 170 is shorted to the conducting faceplate 160 (e.g. and also that conducting faceplate 160 is electrically connected to grounded portions of the electrical connectors 123). It is further understood that the portions of the electrical connection 371-1 external to the housing 150 may also be coated with the conductive coating 170 and/or the electrical connection 371-1 external to the housing 150 may include the conductive layer 121 and be shorted to the conductive coating 170. While in FIG. 4 the conductive coating 170 is depicted only at a depicted edge of the housing 150 (e.g. to show internal components of the housing 150), it is understood that the conductive coating 170 may generally coat exposed surfaces of the housing 150 and/or all exposed surfaces of the housing 150.

Attention is next directed to FIG. 5 which depicts a perspective view of an electrical winding 501 having a longitudinal axis 505, a body 515 with an aperture 519 therethrough, the body 515 having external surfaces 520 and a conductive layer 521. Electrical connectors 523 are located at a longitudinal end and/or at an end-winding position. Indeed, the electrical winding 501 is similar to the electrical winding 101, with like components having like numbers, but in a "500" series" rather than a "100" series. For example, the body 515 is similar to the body 115. However, at the electrical winding 501, the electrical connectors 523 are located at a longitudinal end of the electrical winding 501 (e.g. in an end-winding configuration) rather than along a side (e.g. in a primary-winding configuration) as with the electrical winding 101. Similarly, the conductive layer 521 may be similar to the conductive layer 121 and may have any suitable configuration as described above with respect to the conductive layer 121.

As depicted, electrical connections from a coil located in the body 515 to the electrical connectors 523 are located in a housing 550 (e.g. an insulating encapsulating housing) of the connectors 523, which are held in place via a conducting faceplate 560 and/or frame. The housing 550 and the conducting faceplate 560 may otherwise be similar to the insulating housing 150 and the faceplate 160, but adapted for the geometry of the electrical winding 501. The housing 550 is understood to be coated with a conductive coating 570, electrically connected to the conducting faceplate 560 and the conductive layer 521, as described above. For example, any insulating layer at the body 515 may be removed in a region where an electrical connection between the conductive layer 521 and the conductive coating 570 is to occur, such that, when the conductive coating 570, the conductive coating 570 electrically shorts to the conductive layer 521.

Indeed, the electrical winding 501 is generally otherwise similar to the electrical winding 101, however, at the electrical winding 501, the electrical connectors 523 are located at an end of the body 515 about perpendicular to the longitudinal axis 505 (e.g. an end-winding position).

Attention is next directed to FIG. 6A, FIG. 6B, and FIG. 6C which depict perspective views of a process for attaching and/or adding the connectors 523 to the replaceable winding 501.

For example, FIG. 6A depicts the replaceable winding 501 without the electrical connectors 523 and with electrical connections 571 from electrical conductors inside the replaceable winding 501 (e.g. and/or the body 515). Indeed, the electrical connections 571 are similar to the electrical connections 171 but extend from a longitudinal end of a body of the replaceable winding 501. The electrical connections 571 are connected (e.g. via brazing, bolts, and the like) to respective busbars 581 which are about perpendicular to the longitudinal axis 505.

With reference to FIG. 6B, a unit 590 that includes the electrical connectors 523 and respective electrical leads 591 of the electrical connectors 523, may be attached to respective busbars 581 via braying (e.g. as depicted) and/or respective bolts (e.g. and/or further busbars electrically connected to the electrical leads 591), and the like. As with the electrical windings 101, 301, in some examples, the busbars 581 may be eliminated and the electrical connections 571 may be electrically connected to the electrical leads 591.

The unit 590 may include the electrical connectors 523 being attached and/or spaced from one another via the conducting faceplate 560 and the like, the electrical connectors 523 extending from the conducting faceplate 560, similar to the electrical connectors 123 and the faceplate 160. In some examples, as depicted, respective regions of electrical connection between the busbars 581 and the electrical leads 591 may be wrapped in an electrically insulating tape 592 to assist with encapsulation.

With reference to FIG. 6C, the unit 590, the busbars 581 and the electrical leads 591, and portions of the electrical connections 571 may be encapsulated using an electrically insulating encapsulation material, to form an insulating housing 550 and coated with the conductive coating 570 electrically connected to the conducting faceplate 560 and the conductive layer 521 (e.g. shorted through any insulating layer at the body 515, as described above, and/or in any suitable manner).

Indeed, the replaceable winding 501 is generally otherwise similar to the replaceable winding 101; however at the replaceable winding 501, the electrical connectors 523 are located at an end of the body 515 about perpendicular to the longitudinal axis 505 (e.g. an end-winding position). Similar to the replaceable winding 101, the replaceable winding 501 is protected from corona erosion as external surfaces thereof may be shorted to a common ground, as described above.

Other examples and/or embodiments are within the scope of the present specification. For example, replaceable windings as provided herein may be adapted to include stress grading paint, and the like.

For example, attention is next directed to FIG. 7, FIGS. 8, and 9 which respectively depict: a perspective view of an alternative replaceable winding 701; a perspective view of an end of the replaceable winding 701 that includes connectors, with an encapsulating housing removed, as described in more detail hereafter; and a schematic diagram of electrical connections between conductive layers of the replaceable winding 701.

The replaceable winding 701 is substantially similar to the replaceable winding 501, with like components having like numbers, but in a "700" series rather than a "500" series, other than as described hereafter. In particular, the replaceable winding 701 includes stress grading paint and a different physical arrangement of electrical connectors relative to a body, as compared to the replaceable winding 501.

With attention first directed to FIG. 7, the replaceable winding 701 (e.g. similar to the replaceable winding 501) is arranged along a longitudinal axis 705 and includes a body 715 with an aperture 719 therethrough, the body 715 having external surfaces 720 and a conductive layer 721 thereon. Electrical connectors 723 are located at a longitudinal end and/or at an end-winding position.

It is understood that, similar to the replaceable windings 101, 501, the replaceable windings 701 include electrical connections between a coil (located in the body 715), to the electrical connectors 723. Such electrical connections are located in a housing 750 (e.g. an insulating encapsulating housing), and an adjacent conducting faceplate 760 and/or frame holds the connectors 723.

The housing 750 is understood to be coated with a conductive coating 770, electrically connected to the conducting faceplate 760 and the conductive layer 721, similar to as described above.

Compared to a relative position of the electrical connectors 523 to the body 515 of the replaceable windings 501, the electrical connectors 723 are slightly elevated relative to the body 715 of the replaceable windings 701, with the housing 750 and electrical connections between the coil (located in the body 715, to the electrical connectors 723 adapted accordingly. With reference to FIG. 8, such electrical connections include, but are not limited to, electrical connections 771 and busbars 781, between the connectors 723 and a coil in the body 715.

With attention next direction to FIG. 8 and FIG. 9, the replaceable winding 701 includes stress grading paint 801 (e.g. an electrical stress grading layer) from an abraded region 901 (e.g. as best seen in FIG. 9) of the conductive layer 721 that extends onto an insulating layer 802 at an end of the replaceable winding 701 and under the insulating encapsulating housing 750 (e.g. as also seen in FIG. 9).

A location of conductive coating 770, relative to the stress grading paint 801 and the conductive layer 721 is also shown in FIG. 8, though it is understood that the conductive coating 770 is generally applied after the housing 750 is provided at the replaceable winding 701.

The conductive layer 721 may comprise conductive tape impregnated with insulating resin, and the like. As such, the conductive layer 721 may be abraded to form the abraded region 901 to better make electrical contact between the conductive layer 721 and the stress grading paint 801. In some examples, the insulating layer 802 may comprise glass fiber tape, and the like.

Hence, the stress grading paint 801 is electrically connected to the conductive layer 721 and the conductive coating 770, which are electrically connected to each other, and the stress grading paint 801 extends between the insulating encapsulating housing 750 and the insulating layer 802.

As such, the stress grading paint 801 provides a pathway for electrical fields formed at the conductive layer 721 and the conductive coating 770 to "gracefully" fall off and/or decline between the insulating encapsulating housing 750 and the insulating layer 802. Put another way, the stress grading paint 801 forms a further electrical pathway for dissipation of electrical fields formed at the conductive layer 721 and the conductive coating 770.

For completeness, FIG. 9 further shows an insulating layer 902 (e.g. an insulating tape) applied to, and/or wrapped around, coils of the replaceable winding 701.

Such stress grading paint 801 may be also used at an end of the replaceable winding 701 opposite the end depicted in FIG. 8.

Furthermore, rather than stress grading paint 801, stress grading tape may be used. In general, such stress grading paint and/or stress grading tape comprises any suitable conducting paint and/or tape and/or material which may be used to provides a pathway for electrical fields formed at the conductive coatings of replaceable coils provided herein to "gracefully" fall off and/or decline. Such stress grading paint and/or stress grading tape may alternatively be referred to as an electrical stress grading layer.

Furthermore, such an electrical stress grading layer may be used in the replaceable windings 101, 501 in any suitable location. For example, with brief reference to FIG. 3A and FIG. 4, a portion of the insulating material 304 of the electrical connections 171 may be coated with respective electrical stress grading layers within the housing 150 (e.g. and without otherwise electrically connecting to the wires 303 and the busbars 381), and electrically connected to the conductive layers 121, 170 to provide an electrical pathway for dissipation of electrical fields formed at the conductive layers 121, 170 into the insulating encapsulating housing 150 (e.g. between the insulating encapsulating housing 150 and the insulating material 304). In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some examples, the terms are understood to be "within 10%," in other examples, "within 5%", in yet further examples, "within 1%", and in yet further examples "within 0.5%".

Persons skilled in the art will appreciate that there are yet more alternative examples and modifications possible, and that the above examples are only illustrations of one or more examples. The scope, therefore, is only to be limited by the claims appended hereto.

What is claimed is:

1. An electrical winding for an electromagnetic machine comprising:
    a body having an aperture and electrical conductors wound about the aperture in the body;
    a conductive layer at the body, the conductive layer arranged to electrically shield the electrical conductors;
    electrical connectors at one or more external sides of the body, the electrical connectors electrically connected to the electrical conductors;
    an insulating housing containing electrical connections between the electrical connectors and the electrical conductors;
    a conducting faceplate at the insulating housing, grounding portions of the electrical connectors attached to the conducting faceplate; and
    a conductive coating on the insulating housing, the conductive coating electrically connected to the conducting faceplate and the conductive layer.

2. The electrical winding of claim 1, wherein the conductive layer is located between an external surface of the body and the electrical conductors.

3. The electrical winding of claim 1, wherein the conductive layer is located at least partially beneath an insulating layer at an external surface of the body.

4. The electrical winding of claim 1, wherein the conductive layer is integrated with an insulating layer at an external surface of the body.

5. The electrical winding of claim 1, wherein the conductive coating is electrically connected to the conductive layer via an electrical short through an insulating layer at the external surface of the body.

6. The electrical winding of claim 1, further comprising electrical leads of the electrical conductors, the electrical leads extending from the body and electrically connecting the electrical conductors to the electrical connectors.

7. The electrical winding of claim 1, wherein the electrical connectors are located at an end of the body about perpendicular to a longitudinal axis thereof.

8. The electrical winding of claim 1, wherein the electrical connectors are located at a side of the body about parallel to a longitudinal axis thereof.

9. The electrical winding of claim 1, further comprising an electrical stress grading layer forming an electrical pathway for dissipation of electrical fields formed at conductive layer and the conductive coating.

\* \* \* \* \*